United States Patent
Ohmi et al.

[11] Patent Number: 5,852,416
[45] Date of Patent: Dec. 22, 1998

[54] HIGH SPEED ARITHMETIC LOGIC CIRCUIT

[75] Inventors: Tadahiro Ohmi, 1-17-301, Komegafukuro 2-chome, Aoba-ku, Sendai-shi, Miyagi-ken; Katsuhisa Ogawa, Tokyo, both of Japan

[73] Assignees: Canon Kabushiki Kaisha; Tadahiro Ohmi, both of Tokyo, Japan

[21] Appl. No.: 786,925

[22] Filed: Jan. 23, 1997

[30] Foreign Application Priority Data

Jan. 30, 1996 [JP] Japan ................................ 8-013961

[51] Int. Cl.$^6$ .................................................. G06C 15/00
[52] U.S. Cl. ........................................... 341/144; 341/172
[58] Field of Search ................................ 341/172, 144, 341/150, 118, 120

[56] References Cited

U.S. PATENT DOCUMENTS 4,429,282 1/1984 Saari ........................................... 330/9
4,794,433 12/1988 Milkovic ................................. 324/142

*Primary Examiner*—Marc S. Hoff
*Assistant Examiner*—Peguy JeanPierre
*Attorney, Agent, or Firm*—Fitzpatrick, Cella, Harper & Scinto

[57] ABSTRACT

In order to realize a highly integrated, highly parallel system, there is provided a semiconductor circuit in which two or more input terminals are commonly connected to the non-inverting input terminal (+) of an operational amplifier via first capacitance means, the inverting input terminal (−) of the operational amplifier is connected to the output terminal of the operational amplifier via a second capacitance means two or more input terminals are commonly connected to the inverting input terminal via third capacitance means, and a first floating node as the node between the non-inverting input terminal (+) and the first capacitance means and a second floating node as the node between the inverting input terminal (−) and the second and third capacitance means are connected to reset means.

31 Claims, 8 Drawing Sheets

HIGH SPEED ARITHMETIC LOGIC CIRCUIT

BACKGROUND OF THE INVENTION

1. Field of the Invention

The present invention relates to a semiconductor device capable of various kinds of processing such as parallel arithmetic operations, correlation arithmetic operations, multi-valued logic operations, and the like, and a system using the same such as an arithmetic operation system, image processing system, audio signal processing system, pattern recognition system, signal processing system, parallel data processing system, video signal processing system, or the like.

2. Related Background Art

With the recent advance of integrated circuit techniques, a highly parallel system integrating arithmetic operation elements at a high density is emerging. Also, a redundant binary adder or the like that uses multi-valued logics is beginning to be used in recent LSI.

However, increases in area, consumption of power, and wiring delays due to a complicated internal wiring structure make it difficult to realize a one-chip large-scale highly parallel system densely connecting arithmetic operation elements.

As for multi-valued logics, for example, a redundant binary adder described in Makino, Nakase, Shiohara, et al., "A 8.8-ns 54×54 bit Using New Redundant Binary Architecture", Int. Conf. On Computer Design 1993, pp. 202–205 or the like is known.

In this manner, a binary coding type redundant binary adder or the like is implemented by a binary-digital CMOS integrated circuit. However, it is impossible to decrease the number of wiring lines due to binary level coding. This fact has prevented realization of a highly integrated, highly parallel system.

SUMMARY OF THE INVENTION

It is an object of the present invention to provide a semiconductor device with an arrangement that can solve the problems of increases in area, consumption power, and signal delays due to the complicated wiring structure, and can integrate a multi-valued integrated circuit.

It is another object of the present invention to provide a semiconductor device with an arrangement which is free from any operation errors, can prevent each arithmetic operation stage from transferring an offset voltage to the next stage, and can avoid the influence of the gain in a signal arithmetic operation mode on the operation point.

It is still another object of the present invention to provide various systems represented by an arithmetic operation system, image processing system, audio signal processing system, pattern recognition system, signal processing system, parallel data processing system, and video signal processing system, and to provide a compact system that can attain accurate, high-speed system processing.

It is one aspect of the present invention to provide a semiconductor device wherein an operation amplifier circuit, at least first and second capacitances, and a reset circuit are provided. By appropriate connection of terminals of the OP AMP and the capacitances, the present inventors have found that it is possible to avoid the above-described problems encountered with earlier devices, without sacrificing speed of operation or the like. The details of construction which provide these results are set forth below.

It is another aspect of the present invention to provide a system having the above-mentioned semiconductor device, represented by an arithmetic operation system, image processing system, audio signal processing system, pattern recognition system, signal processing system, parallel data processing system, video signal processing system, and the like.

DETAILED DESCRIPTION OF THE PREFERRED EMBODIMENTS

Figure 1:
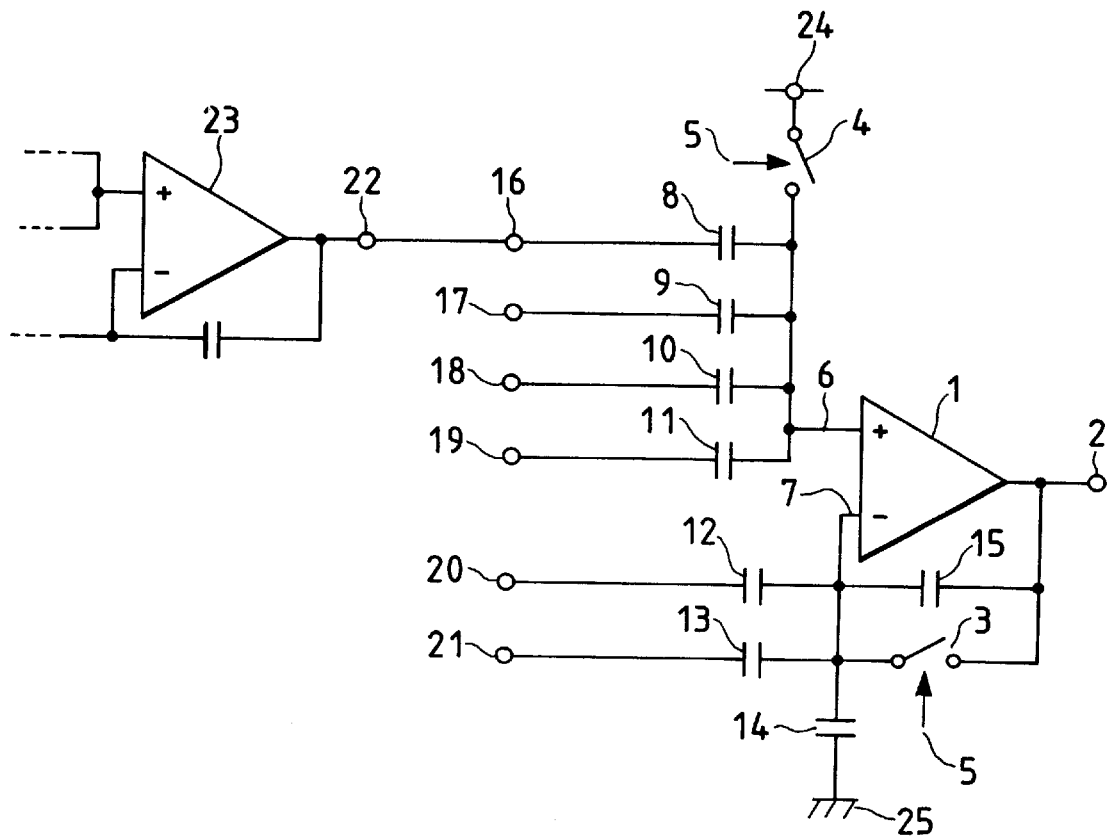
FIG. 1 is schematic circuit diagram for explaining the preferred embodiments of the present invention.

Prior to the description of the embodiments of the present invention, the functions of the present invention will be explained below.

In the present invention, a signal or signals is or are input to the inverting input terminal and/or the non-inverting input terminal of an operational amplifier having a high input impedance via a plurality of capacitance means. At least one capacitance means connected to the inverting input terminal is connected to the output of the operational amplifier, and serves as a capacitance means of a negative feedback loop upon executing an arithmetic operation.

The node between the non-inverting input terminal and the plurality of capacitance means will be referred to as a first floating node hereinafter, and the node between the inverting input terminal and the plurality of (or one) capacitance means will be referred to as a second floating node hereinafter. A first switch means is connected to the first floating node, and the other terminal of the first switch means is connected to a reference voltage source. On the other hand, a second switch means is connected to the second floating node, and the other terminal of the second switch means is connected to the output terminal of the operational amplifier.

Since the first and second switch means are turned on in the reset mode, the operational amplifier is set in the voltage-follower mode with a gain =1, and DC operation points of the respective portions are set. At this time, the non-inverting and inverting input terminals are imaginarily short-circuited, so that the potential of the inverting input terminal nearly equals the reference voltage source applied to the non-inverting input terminal, and the output of the operational amplifier also nearly equals the reference voltage source. In this case, errors generated are only some offset voltage components of the operational amplifier. However, since the gain =1, such errors are not amplified, and the output in the reset mode nearly equals the reference voltage source.

The signal input terminals of the plurality of capacitance means are connected to the operational amplifier of the previous stage, and are similarly reset to a potential nearly equal to the reference potential. Note that no serious problem is posed even when an offset voltage is superposed on the output terminal of the operational amplifier. This is because only changes in signal are transferred via the capacitance means even when the two terminals of the capacitance means have a potential difference therebetween. That is, at this time, since the plurality of capacitance means store an offset of the operational amplifier of the previous stage from the reference voltage, and the operational amplifier operates with reference to the stored offset and transfers only changes in the next arithmetic operation, any offset voltage generated in each stage is not transferred to the next stage.

Since the gain of the operational amplifier is determined by the negative feedback capacitor connected between the output and the non-inverting input terminal, and the ratio between the respective input capacitances, multi-valued linear arithmetic operations can be attained by changing the capacitance ratio. At this time, even when the gain is set to be larger than 1, each DC operation point is determined in the state of the gain =1 in the reset mode, and does not depend on the gain in the signal arithmetic operation mode. In realizing such function, the present invention improves the reliability of the amplitude margin and solves the problem of offset due to transmission, thus realizing a voltage multi-valued integrated circuit.

Also, according to the present invention, a multi-valued logic integrated circuit that processes multi-valued logic having the base 3 or more can be realized in the voltage mode.

The embodiments of the present invention will be described below with reference to the drawings.

<First Embodiment>

The first embodiment of the present invention will be described below with reference to FIGS. 1 to 3.

Figure 2:
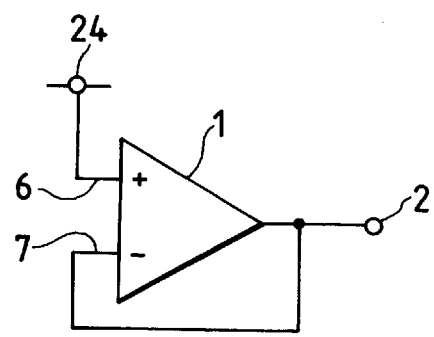
FIG. 2 is schematic equivalent circuit diagram in the reset mode in the present invention.

FIG. 1 shows an arithmetic circuit using operational amplifiers described in the present invention.

Referring to FIG. 1, an operational amplifier 1 with a high input impedance has a non-inverting input terminal 6 and an inverting input terminal 7.

The terminals, on one side, of capacitance means 8 to 11 are commonly connected to the non-inverting input terminal 6.

The terminals, on the other side, of the capacitance means 8 to 11 serve as signal input terminals, and the capacitance means 8, 9, 10, and 11 are respectively connected to input terminals 16, 17, 18, and 19.

The terminals, on one side, of capacitance means 12 to 15 are commonly connected to the inverting input terminal 7. The other terminal of the capacitance means 15 is connected to an output terminal 2 of the operational amplifier 1 to form a negative feedback loop of the system. The other terminal of the capacitance means 14 is connected to a predetermined potential (in this case, a GND potential) to determine the gain of the whole system on the basis of the ratio with respect to the capacitance means 15. The capacitance means 12 and 13 are respectively connected to input terminals 20 and 21.

An output terminal 22 of an operational amplifier 23 of the previous stage is connected to the input terminal 16 to transfer signals. A switch means 4 is inserted between a reference voltage source 24 and the non-inverting input terminal 6, and is turned on/off in response to a reset signal 5. A switch means 3 is inserted between the inverting input terminal 7 and the output terminal 2 of the operational amplifier 1, and is turned on/off in response to the reset signal 5. Since the operational amplifier 1 has a high impedance, the node between the non-inverting input terminal 6 and the commonly connected portion of the capacitance means 8 to 11 is a floating node, which will be referred to as a first floating node hereinafter. The node between the inverting input terminal 7 and the commonly connected portion of the capacitance means 12 to 15 is also a floating node, which will be referred to as a second floating node hereinafter.

The input terminals 17 to 21 are connected to an arithmetic circuit of the previous stage, but are not shown in FIG. 1.

The operation of the arithmetic circuit shown in FIG. 1 will be described below. The reset signal 5 is activated and the switch means 4 and 3 are turned on. The non-inverting input terminal 6 is connected to a reference voltage source 24, and the inverting input terminal 7 is connected to the output terminal 2 of the operational amplifier 1. This state will be referred to as a reset mode hereinafter, in which the DC voltages of the respective portions of the operational amplifier 1 are set. FIG. 2 is a circuit diagram showing the operation in the reset mode. Since the output terminal 2 and the inverting input terminal 7 are connected, the circuit is stabilized in the voltage-follower state with a gain =1. In this state, the non-inverting input terminal 6 and the inverting input terminal 7 are imaginarily short-circuited, so that the potential of the inverting input terminal 7 nearly equals the reference potential applied from the reference voltage source 24 to the non-inverting input terminal 6, and the output terminal 2 of the operational amplifier 1 also nearly equals the reference potential of the reference voltage source 24.

At this time, errors generated are only some offset voltage components of the operational amplifier 1. However, since the gain =1, such error components are not amplified, and the voltage of the output terminal 2 in the reset mode nearly equals the reference voltage of the reference voltage source 24.

The signal input terminal 16 of the capacitance means 8 is connected to the output terminal 22 of the operational amplifier 23 of the previous stage, and is similarly reset to a reference potential nearly equal to the reference voltage of the reference voltage source 24. Note that no serious problem is posed even when an offset voltage is superposed on the output terminal of the operational amplifier 23. This is because only changes in signal are transferred via the capacitance means 8 even when the two terminals of the capacitance means 8 have a potential difference therebetween. That is, since the capacitance means 8 stores an offset of the output terminal 22 of the operational amplifier 23 of the previous stage from the reference voltage, and the operational amplifier operates with reference to the stored offset and transfers only changes in the next arithmetic operation, any offset voltage generated in each stage is not transferred to the next stage.

Figure 3:
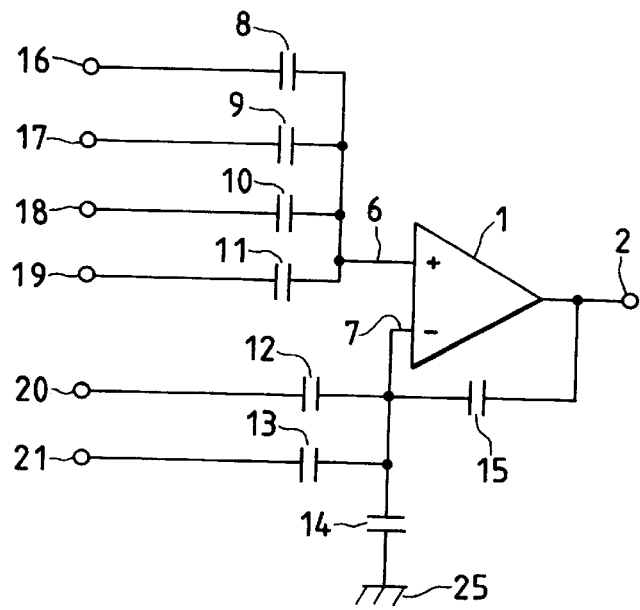
FIG. 3 is schematic equivalent circuit diagram in a signal arithmetic operation mode in the present invention.

A mode in which the reset signal 5 is inactivated and a signal from the operational amplifier 22 of the previous stage is received and processed will be referred to as a signal arithmetic operation mode hereinafter, and FIG. 3 is an equivalent circuit diagram in this state.

The gain of the operational amplifier 1 is determined by the negative feedback capacitance means 15 connected between the output terminal 2 and the inverting input terminal 7, and the capacitance ratio between the grounded capacitance means 14 and the capacitance means 8 to 13. Hence, by changing this capacitance ratio, multi-valued linear arithmetic operations can be attained. At this time, even when the gain is set to be larger than 1, the DC operation point of the output terminal 2 is determined in the state of the gain =1 in the reset mode, and does not depend on the gain in the signal arithmetic operation mode.

In realizing such function, this embodiment improves the reliability of the amplitude margin and solves the problem of offset due to transmission, thus realizing a voltage multi-valued integrated circuit.

The input signals to the arithmetic circuit according to the present invention are not limited to voltage-mode multi-valued signals, but may be analog signals.

<Second Embodiment>

The second embodiment of the present invention will be described below with reference to FIGS. 4 to 8.

Figure 4:
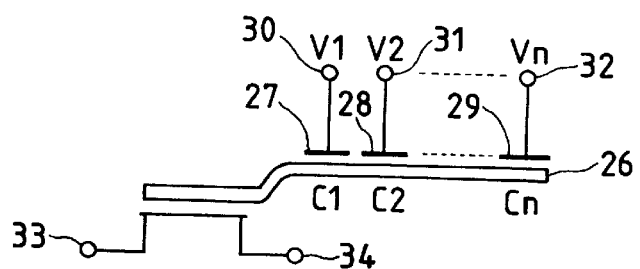
FIG. 4 is a schematic circuit diagram for explaining an example of a νMOS transistor using the present invention.

FIG. 4 is a schematic diagram of a multi-input MOS transistor which has a floating node used in the second embodiment of the present invention as a gate. This multi-input MOS transistor can be realized by, e.g., a two-layered polysilicon CMOS process.

A first gate insulating film is formed on a channel between a source (main electrode) 33 and a drain (main electrode) 34 formed on a semiconductor substrate to be separated from each other, and a floating gate electrode (control electrode) 26 consisting of a first polycrystalline silicon film is formed via the first gate insulating film. N input gate electrodes 27, 28, ..., 29 consisting of a second polycrystalline silicon film are formed on the floating gate electrode 26 via a second gate oxide film. The input gate electrodes 27, 28, ..., 29 are respectively connected to input terminals 30, 31, ..., 32.

In this manner, a multi-input device capacitively coupled to the floating gate electrode 26 via capacitances C1, C2, ..., Cn is realized.

When the N input gate electrodes 27, 28, ..., 29 capacitively coupled to the floating gate electrode 26 are to be formed, the potential of the floating gate electrode 26 equals the weighted mean of input voltages applied to a large number of input gates, and the transistor is turned on/off depending on whether or not the weighted mean value exceeds the threshold value of the transistor. Since this operation resembles that of neurons as basic constituting units of the brain of a living body, such transistor is called a neuron MOS (to be abbreviated as a νMOS hereinafter).

Figure 5:
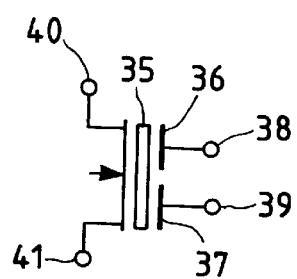
FIG. 5 is a schematic circuit diagram for explaining an example of a 2-input νMOS transistor using the present invention.

FIG. 5 is a schematic diagram of a νMOS having a 2-input capacitive-coupling structure. The νMOS shown in FIG. 5 is constituted by a drain 40, a source 41, a floating gate electrode 35, input gate electrodes 36 and 37, and input terminals 38 and 39 connected to the input gate electrodes 36 and 37. Let Cx be the capacitance formed between the floating gate electrode 35 and the input gate electrode 36, Cy be the capacitance formed between the floating gate electrode 35 and the input gate electrode 37, Vx be the voltage applied to the input terminal 38, and Vy be the voltage applied to the input terminal 39. Then, the potential, $\Phi F$, of the floating gate electrode 35 is given by:

$$\Phi F=(Cx\cdot Vx+Cy\cdot Vy)/(Cx+Cy)$$

In this way, the potential $\Phi F$ of the floating gate electrode 35 equals the weighted mean value of the input voltages, and this weighted mean value is determined by the coupling capacitance ratio of the capacitances.

Accordingly, multi-valued voltage arithmetic operations can be attained at the floating gate electrode 35, and the voltage amplitude value attenuated by calculating the weighted mean is amplified by the negative feedback technique of an operational amplifier to be described later, thus realizing a linear arithmetic operation free from any attenuation.

Figure 6:
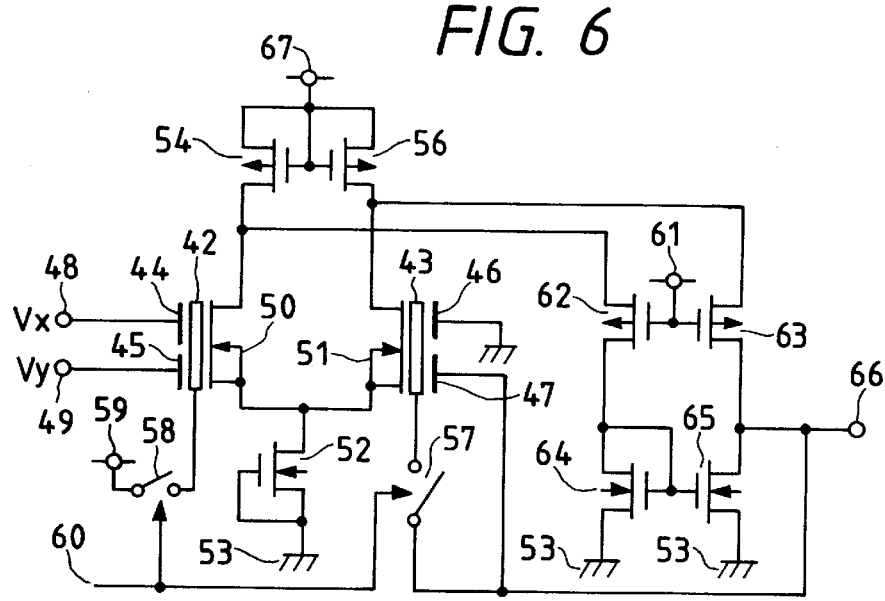
FIG. 6 is schematic circuit diagram for explaining the preferred embodiments of the present invention.

FIG. 6 shows the second embodiment of the present invention that uses νMOS transistors as the input differential stages. The sources of νMOS transistors 50 and 51 are commonly connected to a constant current source constituted by a depletion-type NMOS transistor 52. The depletion-type NMOS transistor 52 is a simple constant current source since its gate and source are connected to a GND potential 53 and are biased by VGS=0.

The drain terminals of the νMOS transistors 50 and 51 are respectively connected to constant current sources constituted by depletion-type PMOS transistors 54 and 56.

The depletion-type PMOS transistors 54 and 56 are simple constant current sources since their gates and sources are connected to a VDD potential 67 and are biased by VGS=0.

Switch means 58 and 57 are connected to floating gate electrodes 42 and 43 of the νMOS transistors 50 and 51, and are turned on/off in response to a reset signal 60. The floating gate electrode 42 serves as a non-inverting floating gate of an operational amplifier, and is capacitively coupled to input gate electrodes 44 and 45. Let Cx be the coupling capacitance between the floating gate electrode 42 and the input gate electrode 44, and Vx be the voltage to be applied to an input terminal 48 of the input gate electrode 44. Also, let Cy be the coupling capacitance between the floating gate electrode 42 and the input gate electrode 45, and Vy be the voltage to be applied to an input terminal 49 of the input gate electrode 45.

The floating gate electrode 43 serves as a floating gate on the inverting input terminal side of the operational amplifier, and is capacitively coupled to input gates 46 and 47. Let Cf be the coupling capacitance between the floating gate 43 and the input gate electrode 47. The input gate electrode 47 is coupled to an output terminal 66 of the operational amplifier, and forms a negative feedback loop upon executing arithmetic operation processing.

Let Ce be the coupling capacitance between the floating gate electrode 43 and the input gate electrode 46. The input gate electrode 46 is coupled to the GND potential 53, and determines the gain of the system together with Cf and Ce upon executing arithmetic operations. The output from an initial-stage amplifier constituted by the νMOS transistors 50 and 51, and the constant current source loads constituted by the depletion-type PMOS transistors 54 and 56, is connected to active loads constituted by depletion-type NMOS transistors 64 and 65 via depletion-type PMOS transistors 62 and 63, the gates of which are connected to a second reference power source 61.

The node between the depletion-type PMOS transistor 63 and the depletion-type NMOS transistor 65 forms the output from the operational amplifier.

Figure 7:
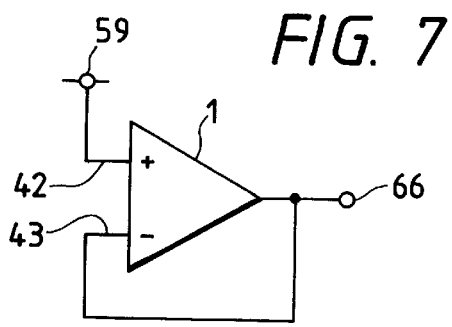
FIG. 7 is schematic equivalent circuit diagram in the reset mode in the present invention.

The operation of this circuit will be explained below. The reset signal 60 is activated, and the switch means 58 and 57 are turned on. The non-inverting input floating gate 42 is connected to a reference voltage source 59, and the inverting input floating gate 43 is connected to the output terminal 66 of the operational amplifier. This state will be referred to as a reset mode hereinafter, in which the DC voltages of the respective portions of the operational amplifier are set. FIG. 7 is a circuit diagram showing the operation in the reset mode. Since the output terminal 66 and the inverting input floating gate 43 are connected, the circuit is stabilized in the voltage-follower state with the gain =1. In this state, the non-inverting input floating gate 42 and the inverting input floating gate 43 are imaginarily short-circuited, so that the potential of the inverting input floating gate 43 nearly equals the potential of the reference voltage source 59 applied to the non-inverting input floating gate 42, and the output terminal 66 of an operational amplifier 1 also nearly equals the reference voltage of the reference voltage source 59.

In this case, errors generated are only some offset voltage components of the operational amplifier 1. However, since the gain =1, such error components are not amplified, and the voltage of the output terminal 66 in the reset mode nearly equals the reference voltage of the reference voltage source 59.

The signal input terminals 48 and 49 are connected to the output of an operational amplifier of the previous stage, and are similarly reset to a reference potential nearly equal to the potential of the reference voltage source 59. As has already been described in the first embodiment, since the capacitance Xc formed by the non-inverting input floating gate 42 and the input gate electrode 44 and the capacitance Cy formed by the non-inverting input floating gate 42 and the input gate electrode 45 store an offset of the output of the operational amplifier of the previous stage from the reference voltage source 59, and the operational amplifier operates with reference to the stored offset and transfers only changes in the next arithmetic operation, any offset voltage generated in each stage is not transferred to the next stage.

Figure 8:
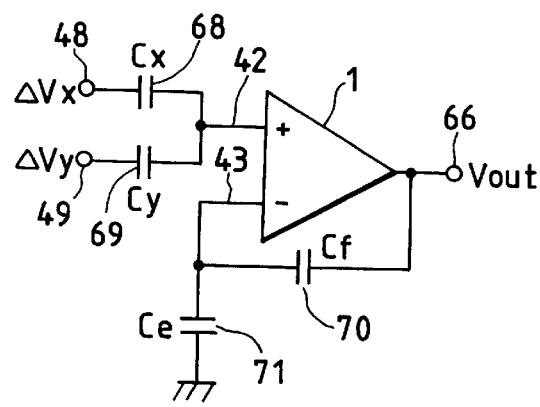
FIG. 8 is schematic equivalent circuit diagram in a signal arithmetic operation mode in the present invention.

A mode in which the reset signal 60 is inactivated and a signal from the previous stage is received and processed will be referred to as a signal arithmetic operation mode hereinafter, and FIG. 8 is an equivalent circuit diagram in this state.

Since the gain of the operational amplifier 1 is determined by the negative feedback capacitance Cf connected between the output terminal 66 and the inverting input floating gate 43, and the capacitance ratio between the grounded capacitance Ce and the two input capacitances Cx and Cy, multi-valued linear arithmetic operations can be attained by changing this capacitance ratio.

In realizing linear arithmetic operations, the weighted mean of input signals appears at the non-inverting input floating gate 42. When $\Delta Vx$ and $\Delta Vy$ represent changes in input signals Vx and Vy from the reset mode, the potential, $\Phi F+$, of the non-inverting input floating gate 42 is given by:

$$\Phi F = (Cx \cdot Vx + Cy \cdot Vy)/(Cx + Cy)$$

If the capacitance ratio between Cx and Cy is 1, $\Phi F+ = (Vx+Vy)/2$, and is ½ the sum of input signals. Note that the imaginary short-circuiting condition is satisfied between the non-inverting input floating gate 42 and the inverting input floating gate 43, and a potential appears at the output terminal 66 after it is amplified in correspondence with the gain determined by the capacitance ratio between the feedback capacitances Cf and Ce. The transfer function of the entire system is described by:

$$\Phi F+ = \{(Ce+Cf)/Cf\} \cdot \{(Cx \cdot Vx + Cy \cdot Vy)/(Cx+Cy)\}$$

By selecting this capacitance ratio to be an appropriate value, multi-valued linear arithmetic operations are attained. At this time, even when the gain is set to be larger than 1, the DC operation point of the output terminal 66 is determined in the state of the gain =1 in the reset mode, and does not depend on the gain in the signal arithmetic operation mode.

In realizing such function, this embodiment improves the reliability of the amplitude margin and solves the problem of offset due to transmission, thus realizing a voltage multi-valued integrated circuit.

Figure 9:
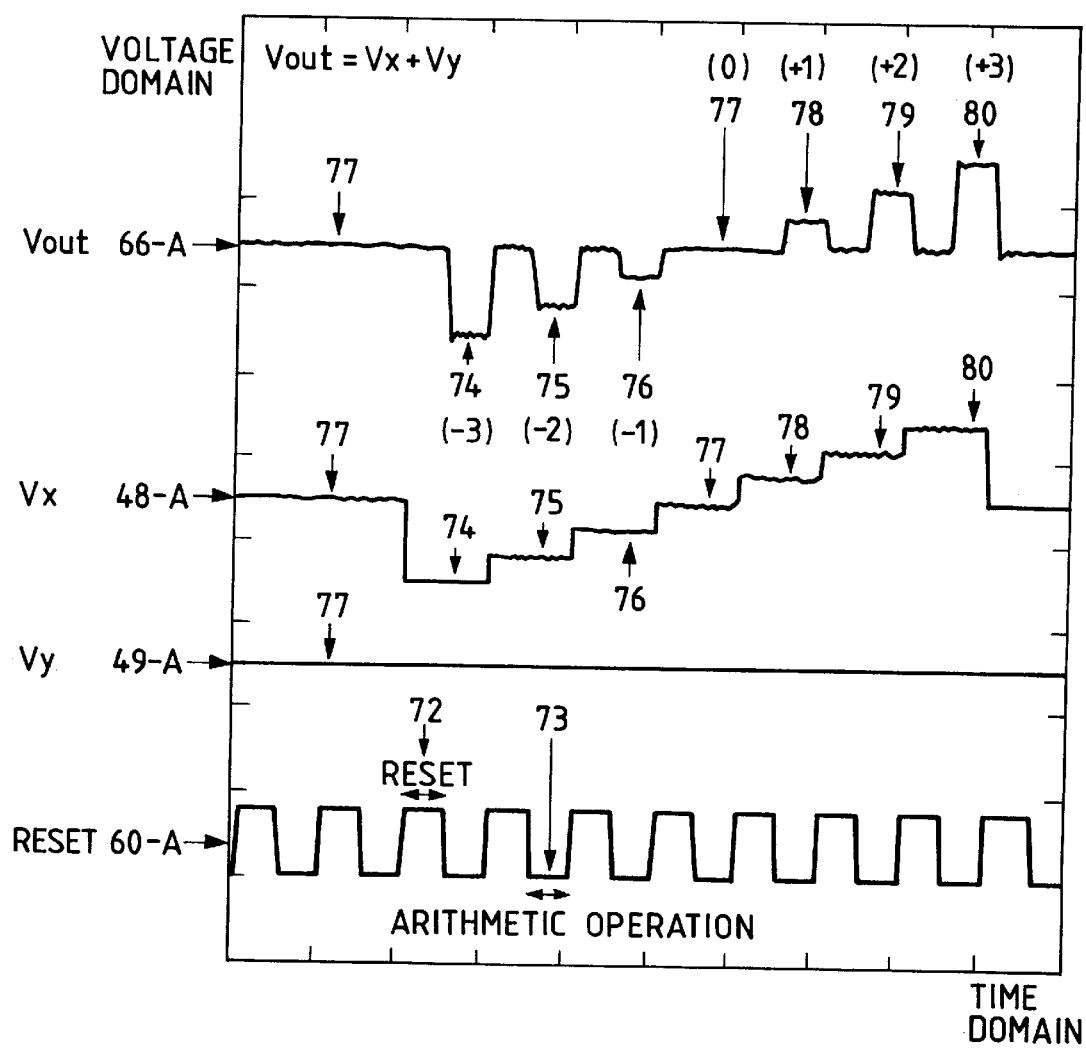
FIG. 9 is chart showing the sample evaluation results using the second embodiment.
Figure 10:
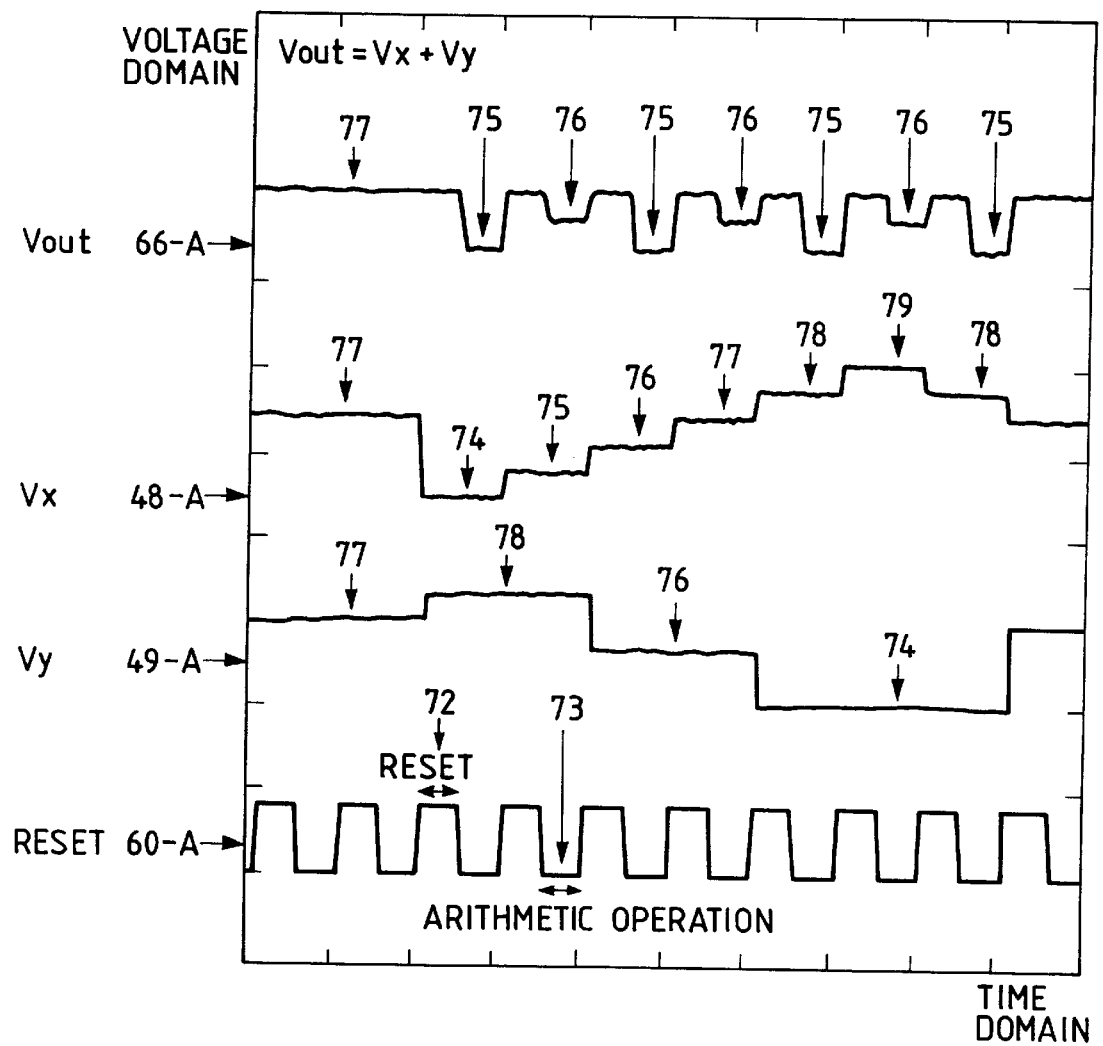
FIG. 10 is chart showing the sample evaluation results using the second embodiment.

FIGS. 9 and 10 show the actual sample evaluation results of the second embodiment. The sample evaluation was made using the circuit shown in FIG. 6.

In FIGS. 9 and 10, 48-A indicates the voltage signal Vx applied to the signal input terminal 48, and 49-A indicates the voltage signal Vy applied to the signal input terminal 49. Also, 60-A indicates a reset signal which allows a reset operation when it is at high level 72, and allows a signal arithmetic operation when it is at low level 73. This multi-valued arithmetic operation result is that in the case of the symmetric quaternary number system having the base 4. The symmetric quaternary number system is a number system having multi-valued levels from −3 to +3, and the respective levels respectively correspond to the following levels. −3 in symmetric quaternary notation corresponds to level 74 in FIG. 9; −2, level 75; −1, level 76; 0, level 77; +1, level 78; +2, level 79; and +3, level 80. In the reset mode, as the voltage value of the reference power source applied to the input of the operational amplifier, level 77 corresponding to 0 in symmetric quaternary notation is input.

In FIG. 9, signals from −3 to +3 are input stepwise in turn to the signal input terminal 48, and level 77 corresponding to 0 in symmetric quaternary notation is input to the signal input terminal 49.

When the reset signal 60-A is at high level 72, the reset mode is set, and an output 66-A is set at level 77 corresponding to 0 in symmetric quaternary notation.

When the reset signal 60-A is at low level 73, the arithmetic operation mode is set, and the gain of the operational amplifier is set so that the output 66-A appears as the linear addition result of the voltage signal 48-A of the signal input terminal 48 and the voltage signal 49-A of the signal input terminal 49. As the output result of the output 66-A in the arithmetic operation mode in FIG. 9, the linear addition result of the input application voltages 48-A and 49-A is output.

FIG. 10 shows the arithmetic operation results obtained when arbitrary combinations of signals corresponding to multi-valued levels −3 to +3 in symmetric quaternary notation are input to both the signal input terminals 48 and 49.

As the output result of the output 66-A in the arithmetic operation mode, the linear addition result of the input application voltages 48-A and 49-A is output. The output 66-A in FIGS. 9 and 10 is reset to level 77 as the reference voltage corresponding to 0 in symmetric quaternary notation in the reset mode. On the other hand, in the arithmetic operation mode, input changes in input application voltage signals 48-A and 49-A from level 77 are linearly added, and the sum of changes from level 77 is accurately output to the output 66-A.

In realizing such function, this embodiment improves the reliability of the amplitude margin and solves the problem of offset due to transmission, thus realizing a voltage multi-valued integrated circuit.

Figure 15:
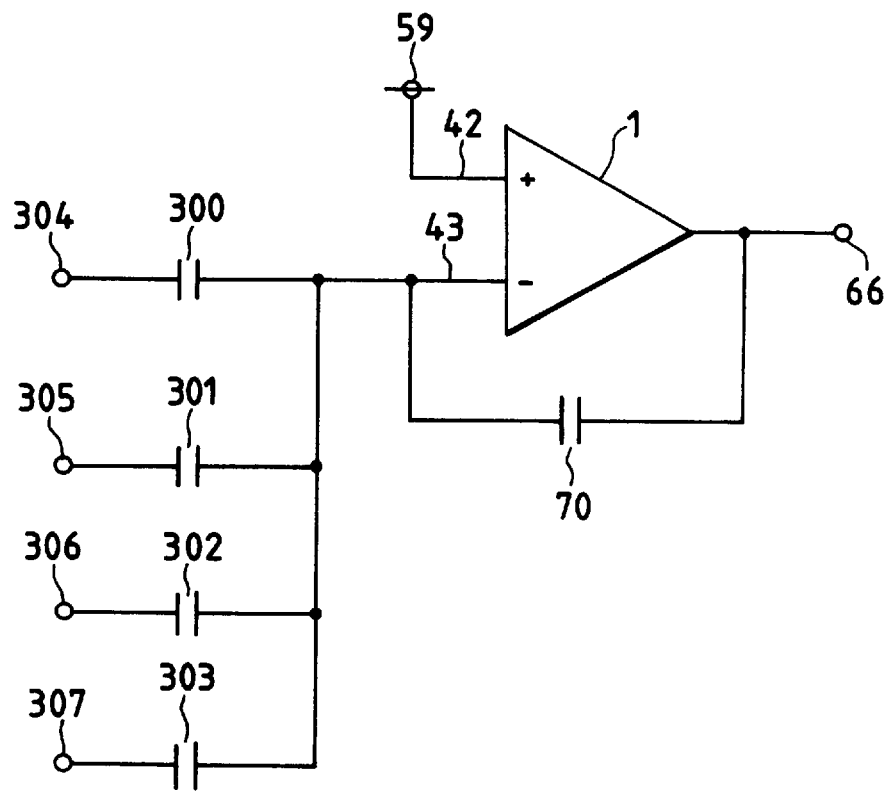
FIG. 15 is a schematic circuit diagram upon applying a signal to the inverting input terminal of an operational amplifier.

In the above description of this embodiment, a plurality of signals are input to the non-inverting floating gate 42 via capacitances. However, the present invention is not limited to such specific format. FIG. 15 is a circuit diagram used when signals are applied to the inverting input terminal of the operational amplifier. As shown in FIG. 15, the reference voltage source 59 is connected to the non-inverting floating gate 42, and a plurality of signals from signal input terminals 304, 305, 306, and 307 are input to the inverting input floating gate 43 via capacitances 300, 301, 302, and 303 to be subjected to calculations.

In this way, the arithmetic operation processing according to the present invention allows concurrent parallel processing by inputting signals to one or both of the inverting and non-inverting input terminals via coupling capacitances.

The input signals to the arithmetic circuit according to the present invention are not limited to voltage-mode multi-valued signals, but may be analog signals.

<Third Embodiment>

Figure 11:
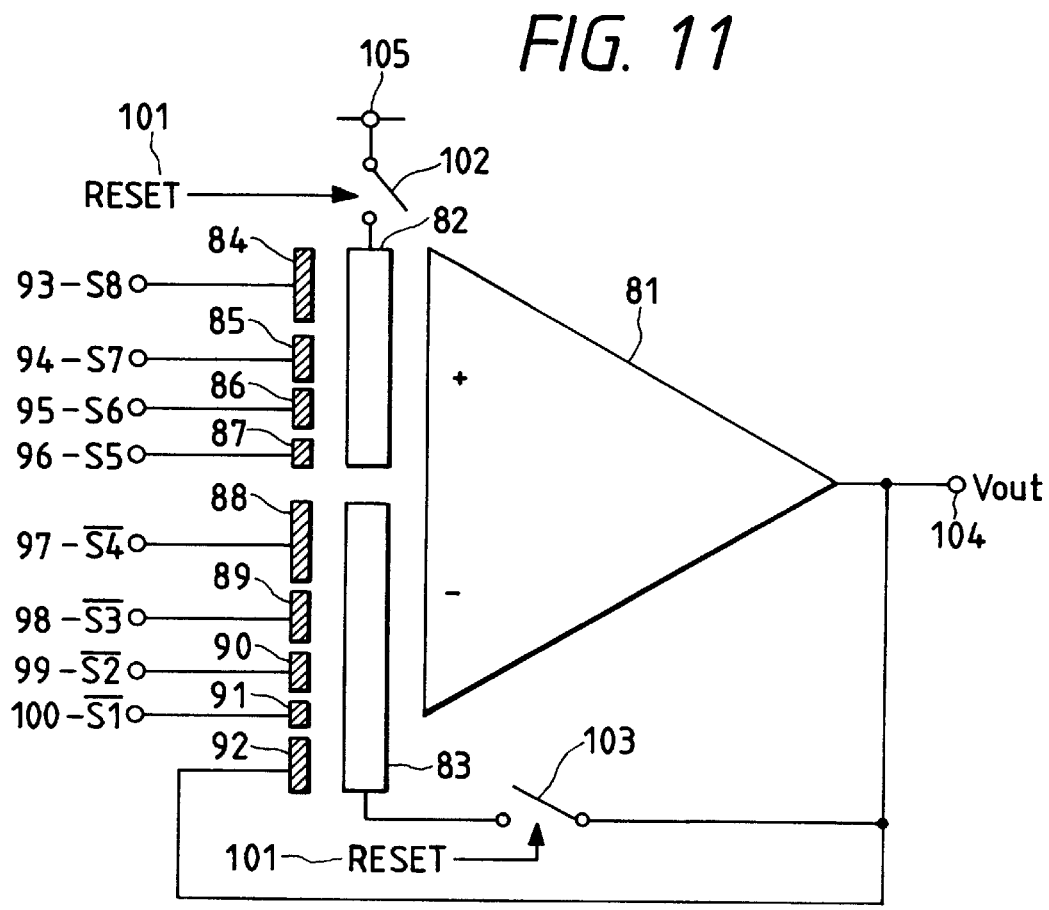
FIG. 11 is a schematic circuit diagram showing an example of an 8-bit D/A converter using an operational amplifier according to the present invention.
Figure 12:
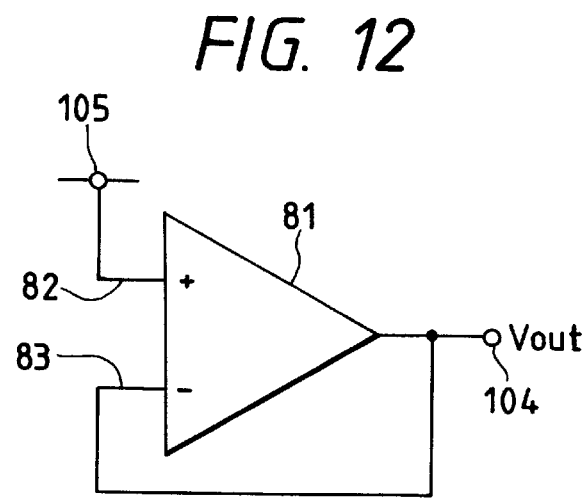
FIG. 12 is an equivalent circuit diagram showing the operation mode upon resetting the D/A converter according to the present invention.
Figure 13:
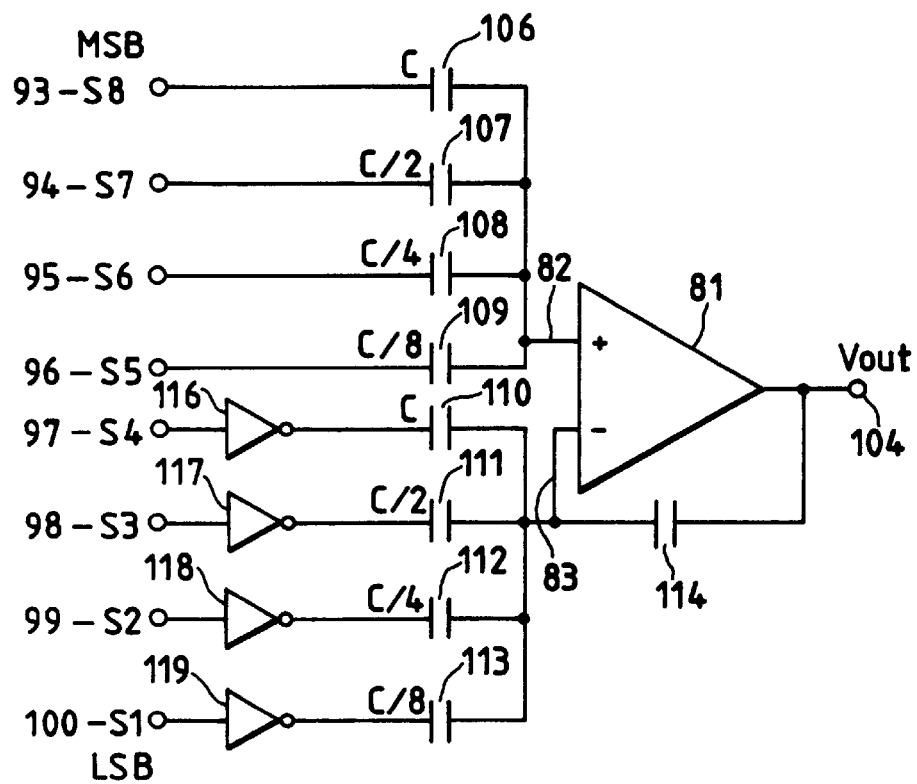
FIG. 13 is an equivalent circuit diagram in an arithmetic operation mode of the D/A converter according to the present invention.

FIGS. 11 to 13 show the third embodiment of the present invention. This embodiment relates to a D/A converter.

FIG. 11 shows a D/A converter of 8 bits or equivalence, which uses the operational amplifier described in the present invention. Of course, the number of inputs is not limited to 8 bits to be described below.

Referring to FIG. 11, the D/A converter includes a high-input impedance operational amplifier 81, a node (floating node) 82 between the non-inverting input terminal (+) of the high-input impedance operational amplifier 81 and capacitance means, and a node (floating node) 83 between the inverting input terminal (−) of the high-input impedance operational amplifier 81 and capacitance means.

The D/A converter also includes input electrodes 84 to 92 of the capacitance means. The input electrodes 84 to 91 are respectively connected to input nodes 93 to 100, and the input electrode 92 is connected to an output terminal 104 of the operational amplifier 81. A reset switch 102 sets the DC potential of the floating node 82, and a reference voltage source 105 is used in the reset mode of the floating node 82 of the non-inverting input terminal (+). A reset switch means 103 resets the floating node 83 of the inverting input terminal (−), and the output terminal 104 and the floating node 83 are short-circuited in the reset mode. Also, the input terminals 93 to 100 are reset to the same voltage as the reference voltage of the reference voltage source 105.

FIG. 12 shows the operation mode in the reset mode. As shown in FIG. 12, the operational amplifier 81 is set in the voltage-follower mode with the gain=1, and the floating node 82 of the non-inverting input terminal (+) is set at the reference voltage of the reference voltage source 105. In addition, since the floating nodes 82 and 83 of the input terminals of the operational amplifier 81 are imaginarily short-circuited in the voltage-follower mode, the terminals including the output terminal 104 are set at the reference voltage of the reference voltage source 105.

FIG. 13 shows the equivalent circuit in the arithmetic operation mode of the D/A converter according to the present invention. As shown in FIG. 13, the terminals, on one side, of capacitances 106, 107, 108, and 109 are commonly connected to the floating node 82 of the non-inverting input terminal (+), and the capacitance values of the capacitances 106, 107, 108, and 109 are respectively weighted to C, C/2, C/4, and C/8. The terminals, on one side, of capacitances 110, 111, 112, and 113 (their capacitance values are respectively weighted to C, C/2, C/4, and C/8) are commonly connected to the floating gate 83 of the inverting input terminal (−), and these capacitances are connected to the input terminals 97 to 100 via inverters 116 to 119. The input terminal 93 corresponds to the MSB of an 8-bit input, the significance of digits lowers bit by bit from the input terminal 94 to the input terminal 99, and the input terminal 100 corresponds to the LSB.

In the arithmetic operation mode, the potential of each of the input terminals 93 to 100 changes from the reference voltage value to VDD when the input voltage is "H"; the potential changes from the reference voltage to GND when the input voltage is "L".

Changes in input voltages at the input terminals 93 to 96 change the potential of the floating node 82 of the non-inverting input terminal (+) via the capacitances 106 to 109. Changes in potential of the floating node 82 supply a non-inverting output to the output terminal 104 of the operational amplifier 81.

On the other hand, input voltages at the input terminals 97 to 100 are inverted by the inverters 116 to 119, and the inverted signals are supplied to the capacitances 110 to 113. Hence, changes in input voltages at the input terminals 97 to 100 are inverted, and the inverted signals are supplied to the floating node 83 of the inverting input terminal (−). That is, the changes in input voltages at the input terminals 97 to 100 are inverted via the inverters 116 to 119, and the inverted signal change components are supplied to the floating node 83 of the inverting input terminal (−) via the capacitances 110 to 113. As a consequence, the direction of changes in output terminal 104 with respect to the input terminals 97 to 100 corresponds to the non-inverting output.

The capacitance 114 for determining the gain is a feedback capacitance that determines the D/A conversion gain. By utilizing the fact that the gain viewed from the input terminals 97 to 100 is lower than that viewed from the input terminals 93 to 96, the effective weights on the capacitances connected to the inverting input terminal (−) can be reduced. Accordingly, the input terminals effectively have weights corresponding to 8 bits in turn from the MSB to LSB.

As can be seen from the above description, in this embodiment, the output potential of the output terminal 104 performs a non-inverting operation with respect to changes in signal at the input terminals 93 to 100, and the input terminals can have weights corresponding to 8 bits in turn from the MSB to LSB using the capacitances with the capacitance ratios C to C/8. In this way, a D/A converter that minimizes element matching errors can be obtained.

When a plurality of D/A converters are integrated on a single chip, and even when errors of the absolute value of the output linearity of the D/A converter have been generated, relative errors among the plurality of D/A converters can be minimized. When relative parallel processing of a plurality of data such as comparison, maximum value detection, minimum value detection, or the like is performed as analog signal processing after D/A conversion, high-precision relative arithmetic operations or the like can be realized using the D/A converter of the present invention.

<Fourth Embodiment>

Figure 14:
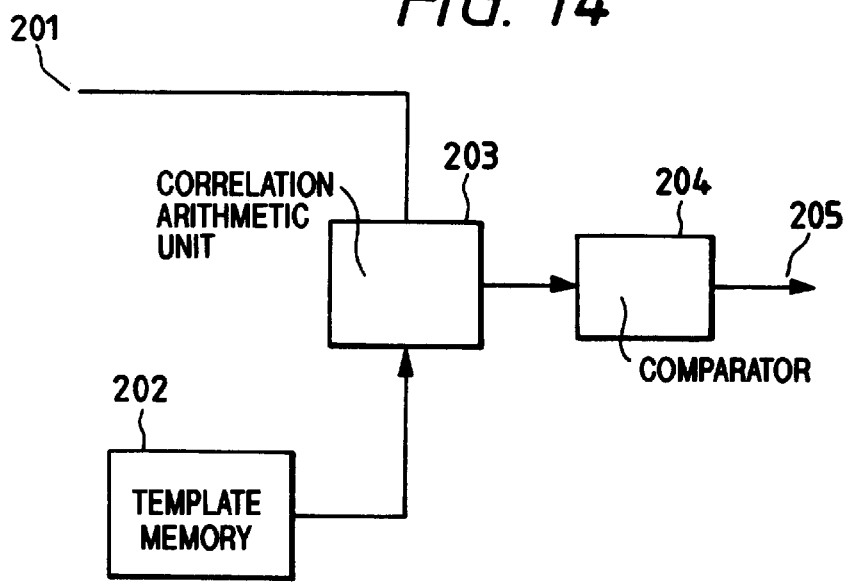
FIG. 14 is a block diagram showing a preferred example of the arrangement of a pattern recognition system capable of parallel processing according to the present invention.

FIG. 14 shows the fourth embodiment of the present invention. This embodiment corresponds to a pattern recognition system capable of parallel processing using the technique of the present invention. Data to be patternrecognized in this system include an image signal, audio signal, signal pattern sequence, video signal, and the like.

Referring to FIG. 14, input data 201 is input to a correlation arithmetic operation unit 203 using the technique of the present invention. A template memory 202 stores many reference data to be pattern-compared with the input data 201. In pattern recognition arithmetic operations, every time input data 201 is input, the data 201 is compared with all the reference data in the template memory 202, and one reference data of the template memory 202, which data has the highest similarity to the input data 201, is selected. For example, processing executed when the input data 201 and many reference data in the template memory 202 are expressed by 8-bit binary signals will be examined below.

The 8-bit input data 201 is input, via capacitances, to the non-inverting input terminal of an operational amplifier using the present invention described in the first embodiment, and 8-bit reference data in the template memory 202 is also input to the inverting input terminal via capacitances. The capacitances connected to the non-inverting and inverting input terminals receive 8-bit binary data, and have capacitance values in correspondence with the weights of the respective digits. As has been described in the first embodiment, the operational amplifier is set in the voltage-follower mode in response to a reset signal so as to set the DC operation points. Thereafter, when the input data 201 and the reference data are input to the operational amplifier, the operational amplifier converts the difference between the input data 201 and the reference data into a multi-valued signal, and outputs the converted signal. When the operational amplifiers corresponding in number to the number of reference data stored in the template memory 202 are prepared in the correlation arithmetic operation unit 203, concurrent parallel comparison with all the reference data can be realized.

A comparator 204 detects reference data with the highest similarity from the correlation arithmetic operation results between the input data and all the reference data in the template memory, which are calculated by the correlation arithmetic operation unit 203. The highest similarity means the smallest difference between the input data and the reference data.

When the comparator 204 selects one reference data stored in the template memory 202, which data has the highest similarity to the input data 201, pattern recognition arithmetic operations are realized. The comparator 204 outputs a pattern recognition output result 205.

When these arithmetic operations are to be realized by conventional binary signal processing based on the CMOS arrangement, an 8-bit difference arithmetic operation circuit for performing a correlation arithmetic operation between the input data 201 and the reference data must have a complicated arrangement, and it becomes harder to realize parallel processing as the number of reference data increases.

When the operational amplifier based on the multi-input parallel processing according to the present invention is used, since the correlation calculation results can be efficiently converted into multi-valued signals by the processing in one cycle, the above-mentioned arithmetic operations can be realized at very high speed using a smaller number of elements.

As described above, since a simple circuit arrangement and high-speed processing are attained, a low-power, low-cost, high-performance pattern recognition system can be realized, and the present invention can be suitably applied to portable equipment aiming at multimedia era.

Figure 16:
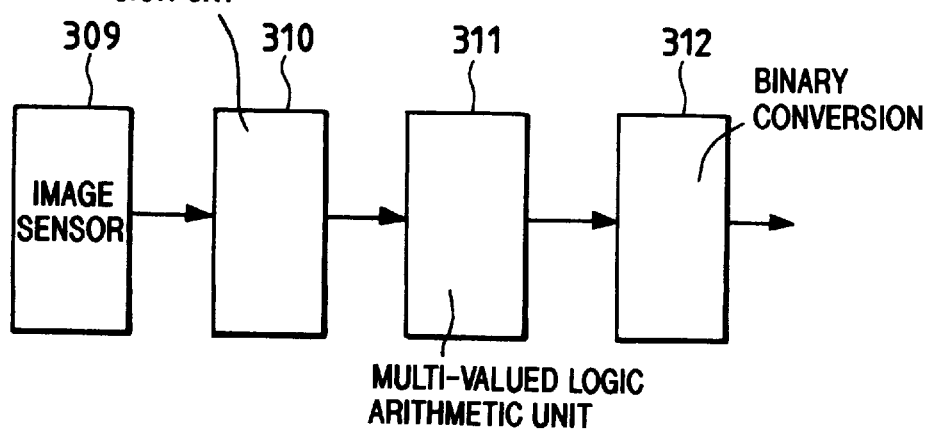
FIG. 16 is a block diagram showing an example of the arrangement of a multi-valued image processing system using the present invention.

Furthermore, FIG. 16 shows a multi-valued image processing system using the present invention.

Referring to FIG. 16, the output from an image sensor 309 is input to an analog/multi-value conversion circuit 310, and is converted into a multi-valued signal. A multi-valued logic arithmetic operation unit 311 uses the technique of the present invention, and is a circuit for performing highly parallel processing of image data converted into the multi-valued signal by the analog/multi-value conversion circuit 310 by utilizing its feature. A block 312 converts the multi-valued signal output from the multi-valued logic arithmetic operation unit into a binary signal, and interfaces with an external circuit.

When real-time image processing is to be performed, a considerably large number of parallel arithmetic operations must be done. When such operations are realized using a conventional binary output digital circuit, a huge hardware scale is required. When the multi-valued arithmetic operation circuit described in the present invention is used in the parallel arithmetic operation unit, it can be realized by a low-power, high-performance, simple circuit. Accordingly, a high-grade multi-function VLSI can be realized by one chip.

As described above, according to the present invention, when a device having floating nodes is used in the signal processing of a multi-valued arithmetic operation circuit, the DC operation points can be set in the voltage-follower mode with the gain =1 independently of the gain in the signal arithmetic operation mode, and the output terminal can be reset while minimizing errors from the reference potential.

When the capacitance means are used as signal transmission means, and the signal input terminals of the capacitance means are connected to an arithmetic operation circuit of the previous stage to reset the circuit, the input capacitance means store an offset from the reference voltage of the arithmetic operation circuit of the previous stage. Hence, since the circuit operates with reference to the output offset from the reference voltage and transfers only changes in the next arithmetic operation, an offset voltage generated in each stage can be prevented from being transferred to the next stage.

Since the gain of the arithmetic circuit is determined by a feedback capacitance connected between the output terminal and the non-inverting input terminal, and the ratio among the respective input capacitances, multi-valued linear arithmetic operations can be realized by changing the capacitance ratio. At this time, even when the gain is set to be larger than 1, each DC operation point is determined in the state of the gain =1 in the reset mode, and does not depend on the gain in the signal arithmetic operation mode.

In realizing such function, the present invention improves the reliability of the amplitude margin and solves the problem of offset due to transmission, thus realizing a voltage multi-valued integrated circuit.

Since the noise margin of the multi-valued logic circuit is improved, a multi-valued logic integrated circuit that processes multi-valued logic having the base 3 or more can be integrated. In this way, increases in area, consumption power, and signal delays caused by the complicated internal wiring structure as the conventional problems can be improved, and a high-base multi-valued logic integrated circuit can be realized. Accordingly, a highly integrated, highly parallel system can be realized.

What is claimed is:

1. A semiconductor device comprising:
   an operational amplifier circuit;
   first capacitance means having one terminal connected to at least two input terminals and the other terminals connected to a non-inverting input terminal of said operational amplifier circuit, wherein the respective terminals of said first capacitance means are connected commonly, thereby constituting a first floating node;

second capacitance means having one terminal connected to an inverting input terminal of said operational amplifier circuit and the other terminals connected to an output of said operational amplifier circuit;

third capacitance means having one terminal connected respectively to at least two input terminals and the other terminals connected to the inverting input terminal of said operational amplifier circuit, wherein the other terminals of said third capacitance means and the one terminal of said second capacitance means are respectively connected commonly to constitute a second floating gate node; and reset means for resetting said first and second floating nodes.

2. A device according to claim 1, wherein said reset means comprises first switch means for connecting said first floating node to a reference power source, and second switch means for connecting said second floating node to the output terminal of said operational amplifier.

3. A device according to claim 1, wherein the inverting input terminal of said operational amplifier is connected to a predetermined voltage source via fourth capacitance means, and at least one of the at least two input terminals is connected to an output terminal of an operational amplifier of a previous stage, and the input terminal connected to the output terminal of the operational amplifier of the previous stage is reset by an output voltage upon resetting the operational amplifier of the previous stage.

4. A device according to claim 1, wherein at least one of the at least two input terminals is connected to an output terminal of an operational amplifier of a previous stage, and the input terminal connected to the output terminal of the operational amplifier of the previous stage is reset by an output voltage upon resetting the operational amplifier of the previous stage.

5. A device according to claim 1, wherein said operational amplifier comprises a differential input stage having the non-inverting input terminal and the inverting input terminal, and said differential input stage comprises a MOS transistor of one conductivity type.

6. A device according to claim 5, wherein said differential input stage comprises a first MOS transistor of the one conductivity type, which transistor uses the non-inverting input terminal as a control electrode terminal, and a second MOS transistor of the same conductivity type as the one conductivity type, which transistor uses the inverting input terminal as a control electrode terminal, main electrode-side terminals, on one side, of said first and second MOS transistors are commonly connected to a constant current source, main electrode terminals on the other side respectively have loads, and the control electrode terminals are respectively connected to said first capacitance means and said second capacitance means or said second and third capacitance means, and a node between the control electrode terminal of said first MOS transistor and said first capacitance means serves as said first floating node, and a node between the control electrode terminal of said second MOS transistor and said second capacitance means or said second and third capacitance means serves as said second floating node.

7. A device according to claim 1, wherein said operational amplifier comprises a first MOS transistor of the one conductivity type, which transistor uses the non-inverting input terminal as a control electrode terminal, and a second MOS transistor of the same conductivity type as the one conductivity type, which transistor uses the inverting input terminal as a control electrode terminal, and said first and second MOS transistors have a plurality of gate electrodes, which are electrically isolated from each other, and are formed on a floating gate electrode via a second gate oxide film, said floating gate electrode being formed, via a first gate insulating film, on a channel region between source-drain regions formed on a semiconductor substrate to be separated from each other.

8. A device according to claim 1, wherein said operational amplifier is an operational amplifier for performing a multi-valued logic calculation having a plurality of discrete levels.

9. A system having a semiconductor device comprising a multi-valued logic arithmetic operation unit constituted by an operational amplifier of claim 8.

10. A system for processing an input signal, comprising a semiconductor device of claim 1.

11. A system according to claim 9, wherein said system includes a system selected from arithmetic operation, image processing, audio signal processing, pattern recognition, signal processing, parallel data processing, and video signal processing systems.

12. A system according to claim 10, wherein said system includes a system selected from arithmetic operation, image processing, audio signal processing, pattern recognition, signal processing, parallel data processing, and video signal processing systems.

13. A device according to claim 1, wherein a D/A converter is constituted in such a manner that inputs corresponding to upper half bits from an MSB side of all bits are commonly connected to the non-inverting input terminal of said operational amplifier via said first capacitance means which are set to have capacitance values corresponding to weights of the bits, and inputs corresponding to lower half bits of all the bits are commonly connected to the inverting input terminal of said operational amplifier via said third capacitance means which have the same capacitance values as the capacitance values connected to the non-inverting input terminal from a larger weight side of the bits, so that the capacitance value corresponding to an LSB is smallest.

14. A system for processing an input signal, comprising a D/A converter of claim 13.

15. A system according to claim 13, wherein said system includes a system selected from arithmetic operation, image processing, audio signal processing, pattern recognition, signal processing, parallel data processing, and video signal processing systems.

16. A device according to claim 1, wherein analog signals are input to the input terminals of said operational amplifier.

17. A system for parallel data processing, which is constituted by a semiconductor device of claim 16 and processes multi-input analog signals.

18. A system for video signal processing, which is constituted by a semiconductor device of claim 16.

19. A semiconductor device comprising:

an operational amplifier circuit;

first capacitance means having one terminal connected respectively to at least two input terminals, and the other terminals connected respectively to a non-inverting input terminal of said operational amplifier circuit, wherein the other terminals of said first capacitance means are connected commonly to constitute a first floating gate;

second capacitance means having one terminal connected to an inverting input terminal of said operational amplifier circuit, and the other terminals connected to an output of said operational amplifier circuit, wherein the one terminal of said second capacitance means are connected commonly to constitute a second floating node; and reset means for resetting the first and second floating nodes.

20. A device according to claim 19, wherein said reset means comprises first switch means for connecting said first floating node to a reference power source, and second switch means for connecting said second floating node to the output terminal of said operational amplifier.

21. A device according to claim 19, wherein the inverting input terminal of said operational amplifier is connected to a predetermined voltage source via fourth capacitance means, and at least one of the at least two input terminals is connected to an output terminal of an operational amplifier of a previous stage, and the input terminal connected to the output terminal of the operational amplifier of the previous stage is reset by an output voltage upon resetting the operational amplifier of the previous stage.

22. A device according to claim 19, wherein at least one of the at least two input terminals is connected to an output terminal of an operational amplifier of a previous stage, and the input terminal connected to the output terminal of the operational amplifier of the previous stage is reset by an output voltage upon resetting the operational amplifier of the previous stage.

23. A device according to claim 19, wherein said operational amplifier comprises a differential input stage having the non-inverting input terminal and the inverting input terminal, and said differential input stage comprises a MOS transistor of one conductivity type.

24. A device according to claim 23, wherein said differential input stage comprises a first MOS transistor of the one conductivity type, which transistor uses the non-inverting input terminal as a control electrode terminal, and a second MOS transistor of the same conductivity type as the one conductivity type, which transistor uses the inverting input terminal as a control electrode terminal, main electrode-side terminals, on one side, of said first and second MOS transistors are commonly connected to a constant current source, main electrode terminals on the other side respectively have loads, and the control electrode terminals are respectively connected to said first capacitance means and said second capacitance means or said second and third capacitance means, and a node between the control electrode terminal of said first MOS transistor and said first capacitance means serves as said first floating node, and a node between the control electrode terminal of said second MOS transistor and said second capacitance means or said second and third capacitance means serves as said second floating node.

25. A device according to claim 19, wherein said operational amplifier comprises a first MOS transistor of the one conductivity type, which transistor uses the non-inverting input terminal as a control electrode terminal, and a second MOS transistor of the same conductivity type as the one conductivity type, which transistor uses the inverting input terminal as a control electrode terminal, and said first and second MOS transistors have a plurality of gate electrodes, which are electrically isolated from each other, and are formed on a floating gate electrode via a second gate oxide film, said floating gate electrode being formed, via a first gate insulating film, on a channel region between source-drain regions formed on a semiconductor substrate to be separated from each other.

26. A device according to claim 19, wherein said operational amplifier is an operational amplifier for performing a multi-valued logic calculation having a plurality of discrete levels.

27. A system having a semiconductor device comprising a multi-valued logic arithmetic operation unit constituted by an operational amplifier of claim 19.

28. A system for processing an input signal, comprising a semiconductor device of claim 19.

29. A system according to claim 27, wherein said system includes a system selected from arithmetic operation, image processing, audio signal processing, pattern recognition, signal processing, parallel data processing, and video signal processing systems.

30. A system according to claim 28, wherein said system includes a system selected from arithmetic operation, image processing, audio signal processing, pattern recognition, signal processing, parallel data processing, and video signal processing systems.

31. A semiconductor device comprising:

an operational amplifier circuit having a non-inverting input terminal connected to a reference voltage;

first capacitance means having one terminal connected to at least two input terminals, and the other terminals connected to an inverting input terminal of said operational amplifier circuit, wherein the other terminals of said first capacitance mans are connected commonly; and second capacitance mans having one terminal connected to the inverting input terminal of said operational amplifier circuit, and the other terminals connected to an output of said operational amplifier circuit.

* * * * *

UNITED STATES PATENT AND TRADEMARK OFFICE
CERTIFICATE OF CORRECTION

PATENT NO. : 5,852,416

DATED : December 22, 1998

INVENTOR(S) : TADAHIRO OHMI ET AL.                    Page 1 of 2

It is certified that error appears in the above-identified patent and that said Letters Patent is hereby corrected as shown below:

[57] ABSTRACT

Line 8, "means" should read --means,--.

COLUMN 7

Line 64, "ΦF=(Cx·Vx+Cy·Vy)/(Cx+Cy)" should read
      --ΦF+=(Cx·Vx+Cy·Vy)/(Cx+Cy)--.

COLUMN 14 line 50, "claim 13," should read --claim 14,--.

COLUMN 15

Line 8, "are" should read --is--.

UNITED STATES PATENT AND TRADEMARK OFFICE
CERTIFICATE OF CORRECTION

PATENT NO.    : 5,852,416

DATED         : December 22, 1998

INVENTOR(S) : TADAHIRO OHMI ET AL.

Page 2 of 2

It is certified that error appears in the above-identified patent and that said Letters Patent is hereby corrected as shown below:

COLUMN 16

Line 50, "mans" should read --means--.
    Line 52, "mans" should read --means--.

Signed and Sealed this

Eighth Day of February, 2000

Attest:

Q. TODD DICKINSON

Attesting Officer

Commissioner of Patents and Trademarks